(12) United States Patent
Van Oevelen et al.

(10) Patent No.: US 8,085,033 B2
(45) Date of Patent: Dec. 27, 2011

(54) PHASE DETECTOR SYSTEM

(75) Inventors: Jacobus Adrianus Van Oevelen, Nijmegen (NL); Winand Van Sloten, Zutphen (NL); Thomas Stork, Hamburg (DE); Michael Hinz, Hamburg (DE)

(73) Assignee: NXP B.V., Eindhoven (NL)

( * ) Notice: Subject to any disclaimer, the term of this patent is extended or adjusted under 35 U.S.C. 154(b) by 562 days.

(21) Appl. No.: 12/066,104

(22) PCT Filed: Aug. 31, 2006

(86) PCT No.: PCT/IB2006/053030
§ 371 (c)(1),
(2), (4) Date: Apr. 13, 2009

(87) PCT Pub. No.: WO2007/029149
PCT Pub. Date: Mar. 15, 2007

(65) Prior Publication Data
US 2009/0212762 A1 Aug. 27, 2009

(30) Foreign Application Priority Data
Sep. 9, 2005 (EP) .................................. 05108291

(51) Int. Cl.
*G01R 25/00* (2006.01)
(52) U.S. Cl. ........... 324/76.77; 702/189; 327/3; 327/14; 327/237; 327/244
(58) Field of Classification Search ................ 324/76.77
See application file for complete search history.

(56) References Cited

U.S. PATENT DOCUMENTS

| 4,575,683 | A | * | 3/1986 | Roberts et al. ............... 329/311 |
| 4,634,895 | A | * | 1/1987 | Luong ............................ 327/62 |
| 4,806,848 | A | * | 2/1989 | Demers ......................... 324/662 |
| 6,088,403 | A | * | 7/2000 | Johnson ........................ 375/340 |
| 6,313,680 | B1 | * | 11/2001 | Havens et al. ................. 327/244 |
| 2005/0246140 | A1 | * | 11/2005 | O'Connor et al. ............ 702/189 |
| 2008/0069020 | A1 | * | 3/2008 | Richardson ................... 370/311 |

FOREIGN PATENT DOCUMENTS

| AU | 739291 B2 | 10/2001 |
| EP | 0329403 A2 | 8/1989 |
| EP | 0621460 A1 | 10/1994 |
| WO | 0157478 A1 | 8/2001 |
| WO | 0254014 A1 | 7/2002 |
| WO | 2005029706 A2 | 3/2005 |

* cited by examiner

*Primary Examiner* — Timothy J Dole
*Assistant Examiner* — Benjamin M Baldridge (57) ABSTRACT

A phase detection system (100) comprises an input terminal (101), first and second peak detectors (103, 113), an averaging unit (107), an offset unit (122), and a comparator (126). Input terminal (101) is coupled to the first and to the second peak detectors (103, 113) and provides an input signal to phase detection system (100). Averaging unit (107) is coupled between offset unit (122) and both the first peak detector and the second peak detector (103, 113), and generates an intermediate signal. Offset unit (122) is coupled to input terminal (101) and generates two comparable signals by applying a predetermined offset in signal strength to the input signal or the intermediate signal. The comparator (126) is coupled to the offset unit (122) and generates an output signal by comparing the two comparable signals which is indicative of the phase of the input signal.

18 Claims, 3 Drawing Sheets

PHASE DETECTOR SYSTEM

The invention relates to the field of phase detector systems and methods for detecting a phase of a signal. In particular, the invention relates to phase detector systems and methods for detecting an initial phase of a periodic signal.

A characteristic of periodic signals is the presence of one global maximum and one global minimum within each period. When such a periodic signal is applied to an input of a signal processing system employing peak detection, it can be required at start up of that system to determine as soon as possible which extremum comes first in order to be on track of the signal as soon as possible. That is, it has to be determined whether a maximum or minimum peak comes first. This question is equivalent to the question whether the input signal is initially rising or falling.

For instance in a speed sensor application of anti-lock braking or traction control systems, it is essential to provide speed information of the moving wheel as soon as possible after start up of the car, since the phase of the periodic sensor signal represents a traveled distance of the moving wheel. If the speed information consists of output pulses, wherein time between pulses being the momentary speed of the wheel, first output edge and first output duty cycle related to the sensor signal are key figures.

For an efficient sensor application this requires a good compromise between first output edge and first duty cycle, because after start up the first output edge provides information about the traveled distance of the wheel, and the time between the first and second edge represents the momentary speed of the wheel.

In known speed sensor implementations, much emphasis was put on giving the first output edge as soon as possible, which resulted in a far less accurate first duty cycle.

From EP 0 329 403 an apparatus for analyzing and reconstructing an analogue signal is known having two comparators which compare positive and negative going slopes of the signal to respective out of phase versions of themselves in order to detect maxima and minima.

However, there may be the need for an alternative phase detector.

An exemplary embodiment of the invention provides a phase detection system comprising an input terminal, a first peak detection unit, a second peak detection unit, and an averaging unit. The phase detection system further comprises an offset unit, and a comparator unit, wherein the input terminal is coupled to the first peak detection unit and to the second peak detection unit and wherein the input terminal is adapted to provide an input signal to the phase detection system. Further, in the system the averaging unit is coupled between the first peak detection unit and the offset unit and between the second peak detection unit and the offset unit, the averaging unit is adapted to generate an intermediate signal and wherein the offset unit is further coupled to the input terminal and is adapted to generate two comparable signals by applying a predetermined offset in signal strength to at least one signal of the group consisting of the input signal and the intermediate signal. Furthermore, in the system the comparator unit is coupled to the offset unit and adapted to generate an output signal by comparing the two comparable signals which output signal is indicative of the phase of the input signal.

In another exemplary embodiment a method for detecting a phase of an input signal the method comprising generating a first sampled signal by sampling the input signal with a first peak detection unit and generating a second sampled signal by sampling the input signal with a second peak detection unit. Further, the method comprises generating an intermediate signal out of the first sampled signal and the second sampled signal, and generating an output signal by comparing the intermediate signal and the input signal in a comparator unit, wherein prior to the comparing a predetermined offset is applied to at least one of the intermediate signal and the input signal and wherein the output signal is indicative for the phase of the input signal.

The system according to the exemplary embodiment may provide a system to determine which peak, i.e. maximum or minimum peak, to look for first. By providing early information about which is the first peak it may be possible to determine the moment for generating initial signal, e.g. speed, information at the output, e.g. first edge and first duty cycle, early after the start up of a signal processing system at which start up the phase and offset of the signal is generally unknown. The phase detection system may provide a good compromise between first edge and first duty cycle accuracy, by detecting the initial phase of the input signal.

From the implementation point of view, the phase detection system may provide a system needing only a small chip area, since determination of direction, i.e. whether the signal is increasing or decreasing first, may be done using only one comparator. As this determination itself may become a process of relative measurement because of using selectable comparator offset, the absolute value of comparator offset may become irrelevant which may eliminating the need of accurate matching, thus chip area may be saved.

From a system point of view, the system according to the exemplary embodiment may provide a first edge, wherein the moment of the generation of the edge signal may be purely related to the initial phase of the sensor signal at start up. This together with the correct peak detections at start up may provide a first duty cycle that may be accurate enough for most signal processing systems.

Furthermore, this phase detection system may be very useful for IC-processes, which do not provide any trimming method. According to the exemplary embodiment, the required matching may be achieved without offset trimming. For the peak detectors, one may chose an implementation which employs capacitors charged with current sources, or an implementation based on a resistive ladder network with switches addressed by a binary counter, as described in WO2005029706 which is hereby incorporated by reference, or any other D/A converter. Thereby, the peak detectors preferably have the property to hold a once measured value till they are reset or till a greater (maximum peak) or smaller (minimum peak) value is measured. Furthermore, the phase detection system may comprise a determining unit adapted to determine the initial phase out of the output signal of the comparator unit.

A characteristic feature according to the present invention may be that two peak detectors are used to generate two signals from an input signal provided to the phase detection system. Out of this two signals an intermediate signal may be generated. Out of this intermediate signal and the input signal information about the phase of the input signal may be derived by a comparator when one of the two signals compared by the comparator is shifted in signal strength before the comparison is done.

Referring to the dependent claims, further preferred embodiments of the invention will be described in the following.

Next, preferred exemplary embodiments of the phase detection system of the invention will be described. These embodiments may also be applied for the method for detecting a phase of an input signal.

According to a further exemplary embodiment of the phase detection system of claim the first peak detector is a maximum peak detector and/or the second peak detector is a minimum peak detector.

Using one maximum and one minimum peak detector may an effective way to provide signals which, when modified and compared, may by indicative for the initial phase of the input signal. Out of this signals of the two peak detectors may be calculated an intermediate signal which may be compared with the input signal. Before comparing these two signals one of this signals, or both, may be modified by applying an offset in signal strength. By using signals for comparison prepared in such a way it might be possible to determine whether the first peak is a maximum or a minimum, i.e. whether the input signal is initially increasing or decreasing, by analyzing the sign of the output signal of the comparator unit. In particular, it might be advantageous in this phase detection system that once the decision is made which peak to look for first, one peak detector may be used for determining the peak while the other peak detector remain its initial value which may be the initial value of the input signal. For example, when it is found that the input signal is increasing the phase detection system will look for a maximum peak first using the maximum peak detector, while the minimum peak detector holds its initial value. In this way, when one of the peaks has been found, the system may have created a history of the input signal which may enable that the first output edge may have a clear relation with the initial phase of the input signal, e.g. the DC offset of the input signal will be irrelevant from this moment on.

In yet a further exemplary embodiment of the phase detection system the averaging unit is adapted to generate an arithmetic mean of a signal of the first peak detection unit and a signal of the second peak detection unit. This arithmetic mean signal may form the intermediate signal.

By generating the intermediate signal as the arithmetic mean of the two signals of the two peak detection systems an effective way for providing an signal with which the active input signal can be compared with. Further, an arbitrary first zero crossing may be provided.

According to still another exemplary embodiment of the phase detection system the phase detection system is further adapted to generate an edge signal. Preferably, the phase detection may be adapted to generate a first preliminary edge signal when the active input signal equals the intermediate signal. Further, the detection system may be adapted to generate a second edge signal when the intermediate signal equals zero.

For generation of this preliminary edge system the point in time in which the input signal equals the averaged signal of the maximum peak detector and the minimum peak detector may be a sufficient estimation. Thus, may lead to an early first edge while for the generation a sufficient exact point in time is provided. Therefore, the phase detection system may provide a good compromise between first edge and first duty cycle accuracy, by detecting the initial phase of the input signal.

The second edge will always represent the true zero crossing of the input signal, because prior to the second edge appearances of both peaks of the signal have been found.

In still a further exemplary embodiment the phase detection system further comprises a state machine. In particular, the state machine may be coupled to at least one unit of the group consisting of the first peak detection unit, the second peak detection unit, the averaging unit and the offset unit.

In yet still a further exemplary embodiment of the phase detection system the state machine is adapted to generate a state signal that determines which signals are applied to the comparator unit and/or which peak detector unit is used to take a sample of the input signal.

In a further exemplary embodiment of the phase detection system the state machine is adapted to switch between different states until a predetermined condition is met. In particular, the predetermined condition may be that the output signal of the comparator uniquely characterizes the phase of the input signal.

Such a predetermined condition may be a condition which uniquely determines whether the input signal is initially increasing or whether the input signal is initially decreasing. For achieving this the state machine may be adapted to provide four different state signals. In a first stage, i.e. when the state machine provides a state signal S0, a sample may be taken with the maximum peak detector. In a second stage, i.e. when the state machine provides a state signal S1, a sample may be taken with the minimum peak detector. If the sampling speed of the peak detectors is high in respect to the frequency of the input signal, the samples taken with both peak detectors may almost be equal. In a third stage, i.e. when the state machine provides a state signal S2, the average of both samples may be compared with the input signal, with a positive offset selected at the comparator. If the comparator output is positive, the signal may be known to be increasing, so a maximum peak may to be found first. In a fourth stage, i.e. when the state machine provides a state signal S3, the average of both samples may be compared with the input signal, with a negative offset selected at the comparator. If the comparator output is negative, the signal may be known to be decreasing, so a minimum peak may to be found first. The state machine may alternately provide state signals S2 and S3 until one of the conditions is met, i.e. the state machine switches between state signals S2 and S3.

In yet another exemplary embodiment of the phase detection system the predetermined offset is set to be smaller than an amplitude of the input signal and/or set to be greater than noise of the input signal. The offset unit may further be adapted so that the offset is greater than intrinsic fluctuations and/or intrinsic differences of any unit out of the group consisting of the peak detecting units, the averaging unit, the comparator unit and the offset unit.

By providing an offset signal considering the above limitations an effective way may be provided to prevent the system making the "wrong choice" of first peak detection at start up, i.e. it can be ensured that a determination which peak (maximum or minimum) has first to be detected is not provoked by noise.

In still another exemplary embodiment of the phase detection system the offset unit comprises a current source and/or a voltage source.

Next, preferred exemplary embodiments of the method for detecting a phase will be described. These embodiments may also be applied for the phase detecting system.

In another exemplary embodiment the method further comprises, providing a first state signal which first state signal triggers the generating of the first sampled signal.

In yet another exemplary embodiment the method further comprises, providing a second state signal which second state signal triggers the generating of the second sampled signal.

In still another exemplary embodiment the method further comprises, providing a third state signal which third state signal effects that the predetermined offset is positive.

In yet still another exemplary embodiment the method further comprises, providing a fourth state signal which fourth state signal effects that the predetermined offset is negative.

In a further embodiment the method further comprises, alternately providing the third state signal and the fourth state signal until a predetermined condition is met.

One aspect of the present invention may be that a phase detection system comprises a initial peak detecting system for determining whether an input signal provides first a minimum peak or provides first a maximum peak, i.e. the input signal is initially a rising signal or a decreasing signal. This initial peak detecting system may or may not be combined with the above described exemplary embodiments of a phase detection system to build a phase detecting system.

According to an exemplary embodiment the initial peak detecting system comprises an input terminal, a first peak detection unit, an offset unit, and a comparator unit, wherein the input terminal is coupled to the first peak detection unit and wherein the input terminal is adapted to provide an input signal to the initial peak detection system. Further, the first peak detection unit is coupled between the input terminal and the offset unit and the offset unit is adapted to receive an intermediate signal. Furthermore, the offset unit is further coupled to the input terminal and is adapted to generate two comparable signals by applying a predetermined offset in signal strength to at least one signal of the group consisting of the input signal and the intermediate signal, and the comparator unit is coupled to the offset unit and adapted to generate an output signal which is indicative of the phase of the input signal by comparing the two comparable signals. In another exemplary embodiment, the initial peak detecting system may comprise further a second peak detection unit coupled to the input terminal. The initial peak detection system may further comprise an averaging unit wherein the averaging unit is coupled between the first peak detection unit and the offset unit and between the second peak detection unit and the offset unit, and wherein the averaging unit is adapted to generate the intermediate signal.

The present invention may be of particular interest in the field of input signal phase detection in any signal processor, in particular analogue signal processor, in which signal phase information is needed soon after start up, for example in the field of anti-lock braking and traction control systems.

A characteristic feature according to the present invention may be that the phase relations, i.e. the sequence of maximum, zero crossing, minimum and zero crossing, may be determined in less than a whole period of the input signal. Thus, the present invention may provide a phase detection system which is adapted to determine this phase relation in a short time. The output of a first preliminary edge signal may be effected at an early stage by using the averaged signal of the minimum and the maximum peak detectors and the active input signal. When these two signals are equal, a first edge signal may be provided which may not be provided at the real zero crossing of the input signal but may be an estimation which may be sufficiently exact for most applications of signal processing systems. The second edge, which may be provided at the moment the averaged signal equals the active input signal a second time, i.e. reaches zero is zero, may always represent the true zero crossing of the input signal since prior to the second edge generation both peaks of the signal have been found.

In order to get the first output edge as soon as possible, one may consider inverting the phase relation between the zero crossings of the input signal and the edges of the output signal. This inverting may result in a first rising edge of the output signal at the first falling edge of the input signal. This may be beneficial when it is demanded that the system always start up with a low output signal.

The aspects defined above and further aspects of the invention are apparent from the examples of embodiment to be described hereinafter and are explained with reference to the examples of embodiment.

The invention will be described in more detail hereinafter with reference to examples of embodiment but to which the invention is not limited.

The illustration in the drawing is schematically. In different drawings, similar or identical elements are provided with the same or similar reference signs.

Figure 1:
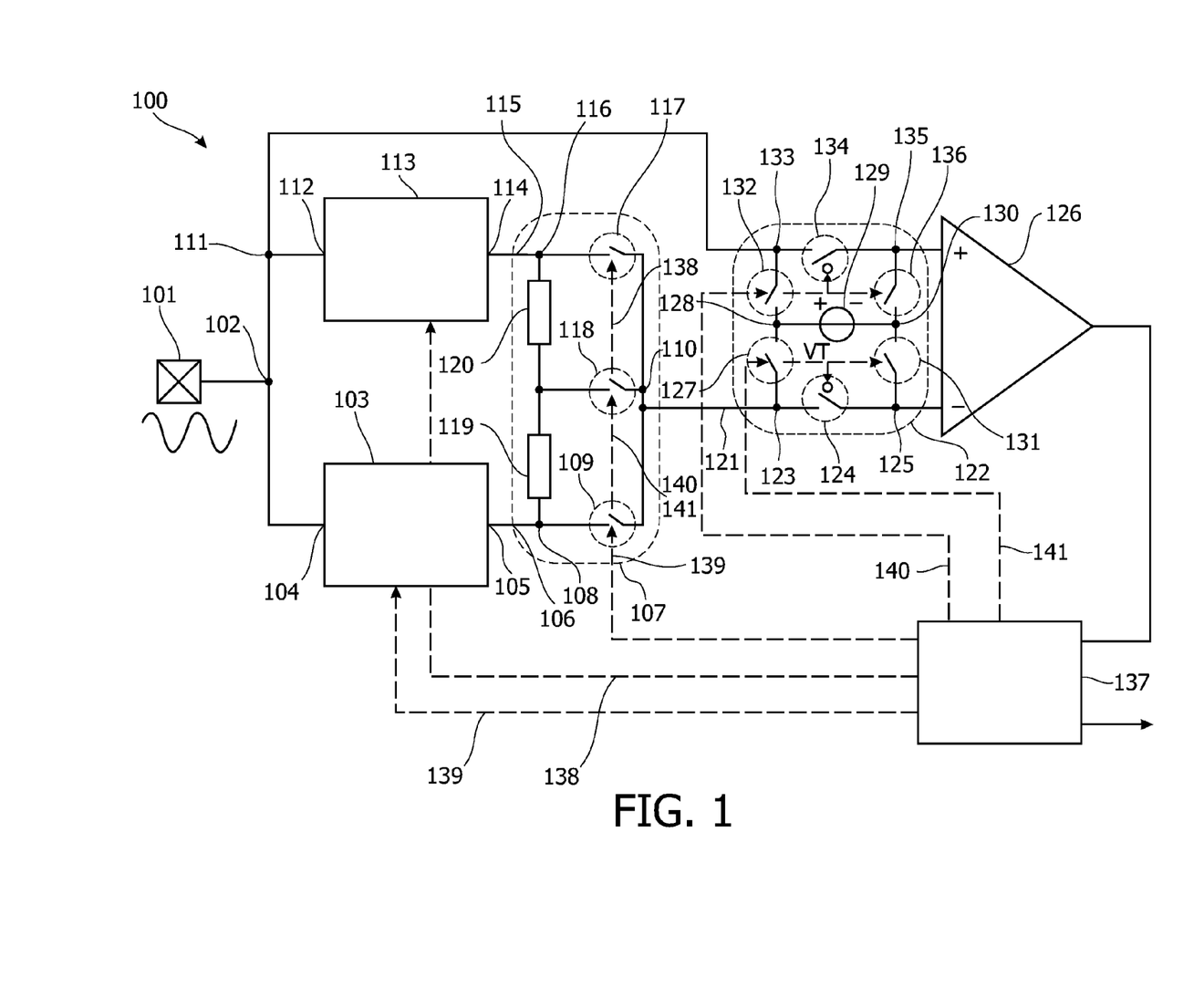
FIG. 1 shows a schematically diagram of an exemplary embodiment of an initial phase detection system.

In the following, referring to FIG. 1, an initial phase detection system 100 according to an embodiment of the present invention is schematically shown. The initial phase detection system 100 comprises an input terminal 101 by which an input signal is provided to the initial phase detection system 100. The input signal can be in the form of a sinusoidal signal as indicated in FIG. 1. The input terminal 101 is coupled to a first node 102 which is coupled to an input terminal 104 of a minimum peak detector 103. An output terminal 105 of the minimum peak detector 103 is coupled to a first input terminal 106 of an averaging unit 107. The first input terminal 106 of the averaging unit is coupled to a second node 108. The second node 108 is coupled to a first terminal of a first switching element 109. A second terminal of the first switching element is coupled to a third node 110.

The first node 102 is further coupled to a fourth node 111 which is coupled to an input terminal 112 of a maximum peak detector 113. An output terminal 114 of the maximum peak detector 113 is coupled to a second input terminal 115 of the averaging unit 107. The second input terminal 115 of the averaging unit 107 is coupled to a fifth node 116 which is coupled to a first terminal of a second switching element 117. A second terminal of the second switching element 117 is coupled to the third node 110.

The second node 108 the first switching element 109 and the third node 110 forms a first branch of the averaging unit 107, while the fifth node 116, the second switching element 117 and the third node 110 forms a second branch of the averaging unit 107.

A third branch of the averaging unit 107 is coupled between the second node 108 the fifth node 116 and the third node 110 and comprises a third switching element 118. Furthermore, the third branch comprises components adapted to generate an average signal averaging the signal provided by the minimum detector unit 103 and the signal provided by the maximum detector unit 113. These components can be formed as resistances shown as 119 and 120 in FIG. 1.

Depending on the states of the first, the second and the third switching elements the averaging unit 107 provides different signals at the third node 110, forming an output terminal of the averaging unit 107. For example, if the first switching element 109 is closed while the second and third switching element is opened on the third node 110 the signal of the minimum peak detector unit is provided. If the third switching element 118 is closed while the first and second switching element is opened the averaged signal is provided at the output terminal 110 of the averaging unit 107.

The third node 110 is coupled to a first input terminal 121 of an offset unit 122, which first input terminal 121 is coupled to a sixth node 123. The sixth node 123 is coupled to a first terminal of a fourth switching element 124. A second terminal of the fourth switching element 124 is coupled to a seventh node 125. The seventh node 125 forms a first output terminal of the offset unit 122 and is coupled to a first input terminal of a comparator unit 126.

The sixth node 123 is further coupled to a first terminal of a fifth switching element 127. A second terminal of the fifth switching element 127 is coupled to an eight node 128. The eight node 128 is coupled to a first terminal of a voltage source 129. A second terminal of the voltage source 129 is coupled to a ninth node 130. The ninth node 130 is coupled to a first terminal of a sixth switching element 131. Alternatively to the voltage source a current source can be used combined with a defined impedance, for example a resistor. A second terminal of the sixth switching element 131 is coupled to the seventh node 125.

Preferably, the fourth, the fifth and the sixth switching elements are adapted so that one control signal for switching the three switching elements can be applied, wherein the fourth switching element 124 is inverted to the fifth switching element 127 and to the sixth switching element 131, i.e. a control signal which closes the fourth switching element 124 will open the fifth switching element 127 and the sixth switching element 131, and vice versa.

The eight node 128 is further coupled to first terminal of a seventh switching element 132. A second terminal of the seventh switching element 132 is coupled to a tenth node 133 which forms a second input terminal of the offset unit 122. The tenth node 133 is coupled to a first terminal of an eight switching element 134. A second terminal of the eight switching element 134 is coupled to an eleventh node 135. The eleventh node 135 forms a second output terminal of the offset unit 122 and is coupled to a second input terminal of the comparator 126. The eleventh node 135 is further coupled to a first terminal of a ninth switching element 136. A second terminal of the ninth switching element 136 is coupled to the ninth node 130.

Preferably, the seventh, the eight and the ninth switching elements are adapted so that one control signal for switching the three switching elements can be applied, wherein the eighth switching element 134 is inverted to the seventh switching element 132 and to the ninth switching element 136, i.e. a control signal which closes the eighth switching element 134 will open the seventh switching element 132 and the ninth switching element 136, and vice versa.

The second input terminal, i.e. the tenth node 133 of the offset unit 122 is further coupled to the fourth node 111, i.e. the input signal can be applied to the second input terminal 133 of the offset unit 122.

An output terminal of the comparator 126 is coupled to an input terminal of a state machine 137. The state machine provides an output signal, which forms the output signal of the initial phase detection system 100. This output signal can provide information about the first peak of the input signal, i.e. whether the input signal first reaches a maximum or a minimum, and/or can form an output edge signal relating to zero crossings of a sinusoidal input signal.

Furthermore, the state machine is adapted to provide a plurality of state signals which are applied to the peak detector units and to the switching elements. A first state signal 138 (S0) is applied to the maximum peak detector 113 and to the second switching element 117. This state signal will close the second switching element 117, i.e. the switching element will provide an electrically conductive path, and will cause that the maximum peak detector unit 113 will sample the input signal, thus the S0 signal may be called SampleMax. A second state signal 139 (S1) is applied to the minimum peak detector 103 and to the first switching element 109. This state signal will close the first switching element 107 and will cause that the minimum peak detector unit 103 will sample the input signal, thus the S1 signal may be called SampleMin.

A third state signal 140 (S2) is applied to the third switching element 118 and to the seventh switching element 132, the eighth switching element 134 and the ninth switching element 136. This state signal will close the third switching element 118, the seventh switching element 132 and the ninth switching element 136 and will open the eight switching element 134. This state signal S2 may be called SelectPosVT since a positive offset is selected at the comparator. The offset also can be interpreted as a threshold, in particular as a voltage threshold (VT). This state signal will cause that the average of both samples is compared with the current input signal with a positive offset selected at the comparator. If the comparator output is positive the signal is known to be increasing, so a maximum peak has to be found first.

A fourth state signal 141 (S3) is applied to the third switching element 118 and to the fourth switching element 124, the fifth switching element 127 and the sixth switching element 131. This state signal will close the third switching element 118, the fifth switching element 127 and the sixth switching element 131 and will open the fourth switching element 124. This state signal S3 may be called SelectNegVT since a negative offset (VT) is selected at the comparator. This state signal will cause that the average of both samples is compared with the active input signal with a negative offset selected at the comparator. If the comparator output is negative the signal is known to be decreasing, so a minimum peak has to be found first.

For the embodiment schematically shown in FIG. 1 it is advantageous to use an offset unit or a comparator unit with a selectable offset, which offset can be set to −VT, "0" or +VT, wherein "0" being the typical offset of the comparator differential pair. So the selectable offset can be set to be +/−VT around an intrinsic offset of the comparator. For the peak detectors, one may chose an implementation which employs capacitors charged with current sources, or an implementation based on a resistive ladder network with switches addressed by a binary counter, or any other D/A converter.

In FIG. 2, typical waveforms of the system according to the embodiment of FIG. 1 are given. FIG. 2 illustrates how the initial phase detection system works. In the state 0, a sample of the input signal is taken with the maximum peak detector. In state 1, a sample of the input signal is taken with the minimum peak detector. When the sample speed of the peak detectors is high in respect to the frequency of the signal, the samples taken with both peak detectors are almost equal.

In state 2 and 3, the average of both samples is taken as reference and compared with the input signal. In state 2, this is done with a positive offset (+VT) selected at the comparator, while in state 3 this is done with a negative offset (−VT) selected at the comparator. When in state 2 the comparator output is positive the signal is known to be increasing, which means that a maximum peak has to be found first. When in state 3 the comparator output is negative the signal is known to be decreasing, which means that a minimum peak has to be found first. As long as none of these conditions is met, the system changes from state 2 to state 3 and vice versa, i.e. the state machine alternating provide the state signal S2 and state signal S3.

It may be advantageously for this system that, once the decision is made which peak to look for first, the other peak detector will remain at its initial value, i.e. being the initial value of the input signal when the system is switched on. In this way, when one of the peaks has been found, the system may have created a history of the input signal enabling the first output edge to have a clear relation with the initial phase of the input signal. That is, from this moment on an DC offset of the input signal will have no influence anymore. According to the described embodiment of the present invention the first output edge will be generated when the input signal is equal to the intermediate signal generated by the averaging unit. This first output edge will be a preliminary output edge signal since the point in time at which it is generated generally may not be a first zero crossing of the input signal. But this preliminary output edge generally provides a first duty cycle which may be accurate enough for most applications. The second edge signal is generated when the intermediate signal, i.e. the averaged signal is zero. Which represent the true zero crossing of the input signal, because prior to the second edge one minimum peak as well as one maximum peak has been found.

Figure 2A:
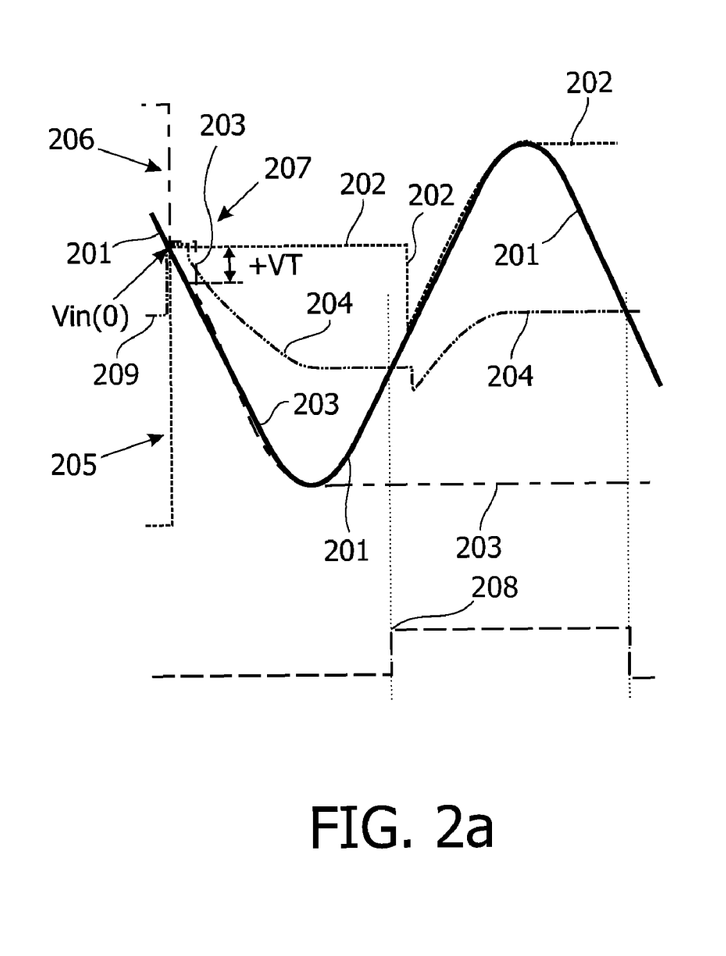
FIG. 2 shows schematically typical waveforms of the initial phase detection system according to the embodiment of FIG. 1.
Figure 2B:
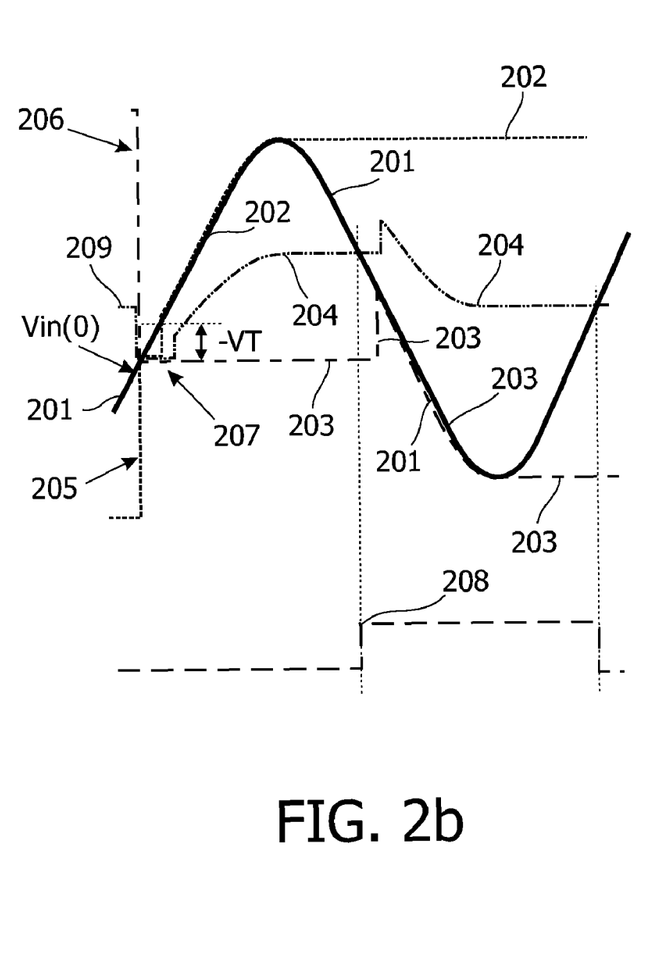

In particular FIG. 2a shows the case in which the initial input signal is first decreasing thus a minimum peak has to be found first, while FIG. 2b shows the case in which the initial input signal is first increasing. The input signal is shown as line 201 in FIG. 2 and represents a sinusoidal signal. At start up of the system the state machine provides the state signal S0 so that the maximum peak detector takes a sample of the input signal. The signal sampled by the maximum peak detector is shown as 202 in FIG. 2. In a next step the state machine provides the state signal S1 so that the minimum peak detector takes a sample of the input signal. The signal sampled by the minimum peak detector is shown as the line 203 in FIG. 2. The initial input signal, i.e. the input signal which is provided is marked as Vin(0). Since the sampling frequency is much higher than the frequency of the input signal the signal sampled by the maximum peak detector is substantially the same as the signal sampled by the minimum peak detector.

After a sampling of both peak detectors is performed once, an arithmetic mean of the two sampled signals can be determined with is substantially the value of each of the sampled signals. This averaged signal is indicated as line 204 in FIG. 2. Afterwards the state machine provides the state signal S2 which effects that the phase detection system enters into a stage in which it is determined whether the input signal is increasing. In this stage the averaged signal is compared with the active input signal whereby a threshold VT is superimposed, which is shown as +VT in FIG. 2a and as −VT in FIG. 2b. When the output of the comparison does not provide a unique signature indicating whether the input signal is increasing the state machine provides the state signal S3. In case of state S2 the unique signature would be that the output of the comparator is positive while a positive offset, selected by the comparator, is superimposed. In the stage effected by the state signal S3 the averaged signal is compared with the input signal with a negative offset selected by the comparator and it is looked for a unique signature which indicates that the input signal is decreasing. In case of state S3 the unique signature would be that the output of the comparator is negative while a negative offset, selected by the comparator, is superimposed. The state machine alternatively provides the state signals S2 and S3 until one of the unique signatures are met. In FIG. 2a this time interval is indicated by the interval in which the maximum value 202 and the minimum value 203 are constant. The time intervals after start up in which the different state signals are provided are indicated in FIG. 2 by the arrows 205, 206 and 207, wherein arrow 205 indicates the interval in which state signal SO is applied, arrow 206 indicates the interval in which state signal S1 is applied, which is substantially the same interval as SO since the sampling frequency is much higher than the frequency of the input signal, which frequency defines the scale of the abscissa of FIG. 2. The arrow 207 indicates the time interval in which alternate state signals S2 and S3 are applied.

When one of the uniquely signatures are met the phase detection system has determined whether the input signal is increasing or decreasing. Then the state machine provides the state signal S0 and S1 depending whether the input signal is increasing (cf. FIG. 2b) and decreasing (cf. FIG. 2a), respectively. At this moment, which is indicated by the vertical jump, in FIG. 2a the minimum peak detector begins to take samples of the input signal. From this moment the sampled signals of the minimum peak detector 203 starts to follow the input signal, while the maximum peak detector provides a constant value, indicated as line 202, thus leading to a decreasing average signal as indicated by line 204.

In FIG. 2b after determining the initial behaviour of the input signal the state signal S0, representing the case that the input signal is increasing, is provided so that the sampled signal of the maximum peak detector 202 starts to change and follows the input signal 201, while the sampled signal 203 of the minimum peak detector is constant, which leads to an increasing average signal 204.

The decreasing, in FIG. 2a and the increasing, in FIG. 2b, occur until the first extremum is reached. From this point in time all three signals, i.e. the signal of the maximum peak detector, the signal of the minimum peak detector and consequently the averaged signal, are constant until the averaged signal equals the active input signal. This point in time can be used as a first estimation of a zero crossing of the input signal and a first output edge is generated which is depicted as line 208 in FIG. 2. Although, no true zero crossing happens at this moment for most application of a signal processing system this point may be a suitable estimation. Furthermore, in FIG. 2a and FIG. 2b the zero line is suggested by the small line labelled 209.

Furthermore, at this moment the state machine will switch the phase detection system into the other sampling state as before so that the phase detection system searches for the second extremum. That is, in FIG. 2a the state machine switches from state signal S1 to state signal S0, while in FIG. 2b the state machine switches from state S0 to S1. This is a suitable time for the start for the searching for the second extremum since before this moment the second peak cannot be reached. In FIG. 2a and FIG. 2b this switching is indicated by the vertical jump of the maximum signal (FIG. 2a) or minimum signal (FIG. 2b) and of the average signal 204. This vertical jump is generated by a resetting of the maximum peak detector (FIG. 2a) or the minimum peak detector (FIG. 2b). This resetting is optional and an embodiment without such a resetting is also possible. In an embodiment without a resetting the corresponding peak detector will wait until the input signal crosses the output level of the peak detector, i.e. in case of FIG. 2a till the input signal crosses the output level of the maximum detector. For better presentability the vertical lines are shifted some distance to the right. For better presentability also some other lines in FIG. 2a and FIG. 2b are shifted some distance in vertical or horizontal direction, in particular lines 202 and 203 in case they would lie on top of line 201. In principle the switching of the state machine can be implemented at any time between the point in time in which the first extremum has been reached and the above described point which serves as a first estimation of the zero crossing.

After this switching the sampled signal of the other peak detector follows the input signal. That is, in FIG. 2a the signal 202 of the maximum peak detectors starts to follow the input signal 201, while the signal 203 of the minimum peak detector remains constant, which leads to an increase of the average signal. In FIG. 2b the signal 203 of the minimum peak detectors starts to follow the input signal 201, while the signal 202 of the maximum peak detector remains constant, which leads to a decrease of the average signal. The sampled signals of the active peak detectors, i.e. maximum peak detector in FIG. 2a and minimum peak detector in FIG. 2b follows the input signal until the moment in time in which the respective extremata are reached. From this moment on all three signals, i.e. the signal of the maximum peak detector, the signal of the minimum peak detector and consequently the averaged signal, are constant. The moment in which the active input signal 201 equals a second time the averaged signal 204 represents a true zero crossing of the input signal since at this moment a maximum and a minimum has been run through. After this moment the transient effect of the start up is ends and the correct phase relation, i.e. the correct amplitude and the correct points in time for the zero crossings are determined.

Figure 3:
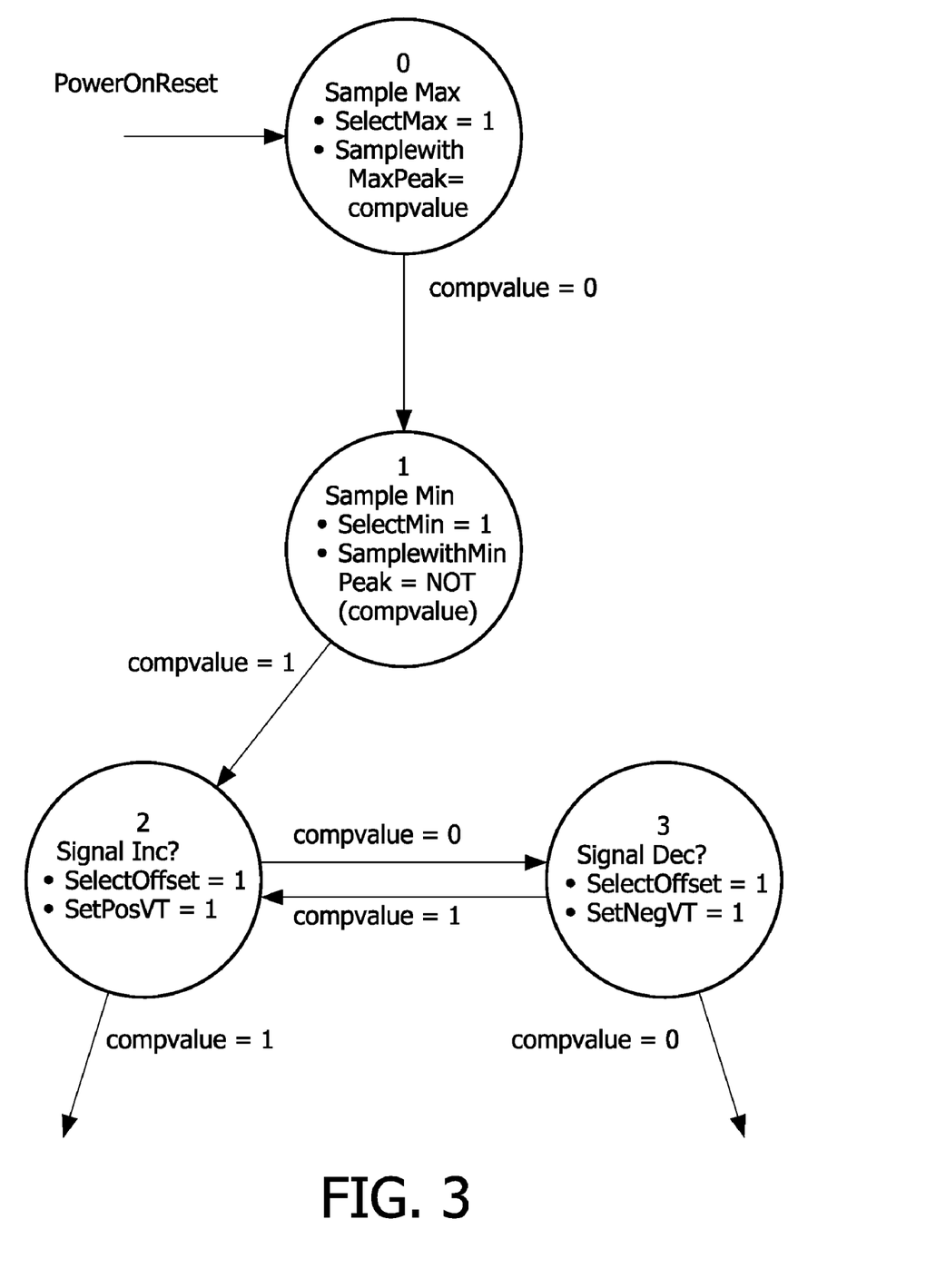
FIG. 3 shows a schematically state sequence of the initial phase detection system according to the embodiment of FIG. 1.

In the following, referring to FIG. 3, a state sequence at start up of an initial phase detection system according to the embodiment of FIG. 1 is schematically shown. When the system is started (PowerOnReset) the state signal S0 is provided by the state machine, which effects that a parameter SelectMax, which indicates that the maximum is sampled, is set to one for allowing a sampling of the maximum peak detector. As a first coarse estimation of the maximum value of the input signal the initial comparison value can be used. These facts are schematically illustrated in FIG. 3 by SampleMax, SelectMax=1 and SamplewithMaxPeak=compvalue.

In a second step the state signal S1 is provided by the state machine, which effects that a parameter SelectMin, which indicates that the minimum is sampled, is set to one for allowing a sampling of the minimum peak detector. As a first coarse estimation of the minimum value of the input signal the negative value of the initial comparison value can be used. These facts are schematically illustrated in FIG. 3 by SampleMin, SelectMin=1 and SamplewithMinPeak=NOT(compvalue).

In a third step the state signal S2 is provided by the state machine, which effects that it is determined whether the input signal is increasing. In this step the parameter SelectOffset is set to one and also the variable SetPosVT is set to one. These two variables indicate that an offset is set at the comparator and this offset is set to a positive value. These facts are schematically illustrated in FIG. 3 by Signal Inc?, SelectOffset=1 and SetPosVT=1. If in the third step the comparison of the signals provides a positive value, i.e. compvalue=1, it is determined that the input signal is increasing and a maximum peak is searched for first.

If in the third step the comparison of the signals provides a negative value, i.e. compvalue=0, in a fourth step the state signal S3 is provided by the state machine, which effects that it is determined whether the input signal is decreasing. In this step the variable SelectOffset is set to one and also the variable SetNegVT is set to one. These two variables indicate that an offset is set at the comparator and this offset is set to a negative value. These facts are schematically illustrated in FIG. 3 by Signal Dec?, SelectOffset=1 and SetNegVT=1. If in the fourth step the comparison of the signals provides a negative value, i.e. compvalue=0, then it is determined that the input signal is decreasing and a minimum peak is searched for first. If the comparison provides a positive value the state machine returns back to the third step and provides again the state signal S2. This changing between state signal S2 and S3 is performed until the behaviour of the input signal, i.e. whether it increases or decreases, is identified.

The parameter "SelectMax" concerns the closing of switch 117 in FIG. 1, i.e. the state in which the maximum peak detector samples the input signal, the parameter "SelectMin" concerns the closing of switch 139 in FIG. 1, i.e. to the state in which the minimum peak detector samples the input signal, while the parameter "SelectOffset" concerns the closing of switch 118 in FIG. 1, i.e. to the state in which the offset or averaged value is provided to the offset unit. The signal or parameter "compvalue" is used for state transitions. In state 0, i.e. when the state machine provides the signal corresponding to state 0, "compvalue" serves as an indicator to show whether the first sample of the maximum peak detector has been found. As long as "compvalue"=1 the first sample of the maximum detector has not been found. As soon as "compvalue"=0 a transition takes place from state 0 to state 1, i.e. the state machine provides the state signal S1. In state 1 "compvalue" serves as an indicator to show that the first sample of the minimum detector has not been found yet. As long as "compvalue"=0 the first sample of the minimum peak detector has not been found. As soon as "compvalue"=1 the first sample of the minimum peak detector was found and a further state transition takes place from state 1 to state 2.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

The invention claimed is:

1. A phase detection system comprising:
an input terminal;
a first peak detection unit;
a second peak detection unit;
an averaging unit;
an offset unit; and
a comparator unit,
wherein the input terminal is connected to the first peak detection unit and to the second peak detection unit and wherein the input terminal provides an input signal to the phase detection system;
wherein the averaging unit is connected between the first peak detection unit and the offset unit and between the second peak detection unit and the offset unit, and wherein the averaging unit generates an intermediate signal;
wherein the offset unit is further connected to the input terminal and generates two comparable signals by applying a predetermined offset in signal strength to at least one signal of the group consisting of the input signal and the intermediate signal; and
wherein the comparator unit is connected to the offset unit and generates an output signal which is indicative of the phase of the input signal by comparing the two comparable signals, and wherein the phase detection system generates a first preliminary edge signal when the input signal equals the intermediate signal, and wherein the phase detection system generates a second edge signal when the intermediate signal equals zero.

2. The phase detection system of claim 1, wherein the first peak detector is a maximum peak detector.

3. The phase detection system of claim 1, wherein the second peak detector is a minimum peak detector.

4. The phase detection system according to claim 1, wherein the system further comprises a state machine.

5. The phase detection system according to claim 4, wherein the state machine is connected to at least one unit of the group consisting of the first peak detection unit, the second peak detection unit, the averaging unit and the offset unit.

6. The phase detection system according to claim 4, wherein the state machine generates a state signal that determines which signals are applied to the comparator unit and/or which peak detector unit is used to take a sample of the input signal.

7. The phase detection system according to claim 6, wherein the state machine switches between different states until a predetermined condition is met.

8. The phase detection system according to claim 7, wherein the predetermined condition is that the output signal of the comparator uniquely characterises the phase of the input signal.

9. The phase detection system according to claim 8, wherein the averaging unit generates an arithmetic mean of a signal of the first peak detection unit and a signal of the second peak detection unit.

10. The phase detection system according to claim 9, wherein the predetermined offset is set to be smaller than an amplitude of the input signal.

11. The phase detection system according to claim 10, wherein the predetermined offset is set to be greater than noise of the input signal.

12. The phase detection system according to claim 1, wherein the offset unit comprises a voltage source and/or a current source combined with a defined impedance.

13. A method for detecting a phase of an input signal, the method comprising:

generating a first sampled signal by sampling the input signal with a first peak detection unit;

generating a second sampled signal by sampling the input signal with a second peak detection unit;

generating an intermediate signal out of the first sampled signal and the second sampled signal; and generating an output signal by comparing the intermediate signal and the input signal in a comparator unit, wherein prior to the comparing a predetermined offset is applied to at least one of the intermediate signal and the input signal and wherein the output signal is indicative of the phase of the input signal.

14. The method according claim 13 further comprising:
providing a first state signal which first state signal triggers the generating of the first sampled signal.

15. The method according claim 13 further comprising:
providing a second state signal which second state signal triggers the generating of the second sampled signal.

16. The method according to claim 13 further comprising:
providing a third state signal which third state signal effects that the predetermined offset is positive.

17. The method according claim 16 further comprising:
alternately providing the third state signal and the fourth state signal until a predetermined condition is met.

18. The method according to claim 13 further comprising:
providing a fourth state signal which fourth state signal effects that the predetermined offset is negative.

* * * * *